(12) United States Patent
Cherukuri et al.

(10) Patent No.: US 7,805,619 B2
(45) Date of Patent: Sep. 28, 2010

(54) CIRCUIT TECHNIQUE TO REDUCE LEAKAGE DURING REDUCED POWER MODE

(75) Inventors: John R. Cherukuri, Folsom, CA (US); Ak R. Ahmed, Rancho Condova, CA (US); Arun Subbiah, Folsom, CA (US); Satish Damaraju, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 1114 days.

(21) Appl. No.: 11/394,564

(22) Filed: Mar. 31, 2006

(65) Prior Publication Data

US 2007/0236256 A1   Oct. 11, 2007

(51) Int. Cl.
*G06F 1/32* (2006.01)

(52) U.S. Cl. .................... 713/300; 713/320; 713/323

(58) Field of Classification Search .......... 713/300–375
See application file for complete search history.

(56) References Cited

U.S. PATENT DOCUMENTS

| 5,563,839 | A | * | 10/1996 | Herdt et al. ................. 365/227 |
|---|---|---|---|---|
| 5,602,496 | A | * | 2/1997 | Mahmood ..................... 326/71 |
| 6,320,795 | B1 | | 11/2001 | Balamurugan et al. |
| 6,388,940 | B1 | | 5/2002 | Alvandpour et al. |
| 6,504,401 | B1 | * | 1/2003 | Huang et al. ................... 326/81 |
| 6,643,199 | B1 | * | 11/2003 | Tang et al. ................... 365/204 |
| 6,748,546 | B1 | * | 6/2004 | Mirov et al. ................. 713/320 |
| 6,845,432 | B2 | | 1/2005 | Maiyuran et al. |
| 2003/0031321 | A1 | * | 2/2003 | Mages ......................... 380/270 |
| 2003/0042946 | A1 | * | 3/2003 | Chen et al. ................... 327/143 |
| 2003/0112678 | A1 | | 6/2003 | Hsu et al. |
| 2004/0119503 | A1 | | 6/2004 | Jamshidi et al. |
| 2005/0068801 | A1 | | 3/2005 | Chatterjee et al. |
| 2005/0068827 | A1 | | 3/2005 | Wijeratne et al. |
| 2005/0094474 | A1 | * | 5/2005 | Deng et al. .................. 365/229 |
| 2006/0013035 | A1 | | 1/2006 | Hsu et al. |
| 2006/0028881 | A1 | * | 2/2006 | King ...................... 365/189.05 |
| 2006/0067136 | A1 | | 3/2006 | Hsu et al. |

* cited by examiner

*Primary Examiner*—Mark Connolly
*Assistant Examiner*—Paul B Yanchus, III
(74) *Attorney, Agent, or Firm*—Erik R. Nordstrom

(57) ABSTRACT

Provided herein are schemes for reducing leakage in dynamic circuits during sleep modes.

5 Claims, 2 Drawing Sheets

CIRCUIT TECHNIQUE TO REDUCE LEAKAGE DURING REDUCED POWER MODE

BACKGROUND

Integrated circuits (ICs) use logic and memory circuits that utilize dynamic (or domino) logic. Such circuits include multi-read ported register file circuits, as well as other circuits typically requiring fast performance. Unfortunately, even while in so-called sleep modes, they can leak and thereby consume excessive power. Accordingly, improved schemes to reduce power consumption of dynamic circuits in sleep modes are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
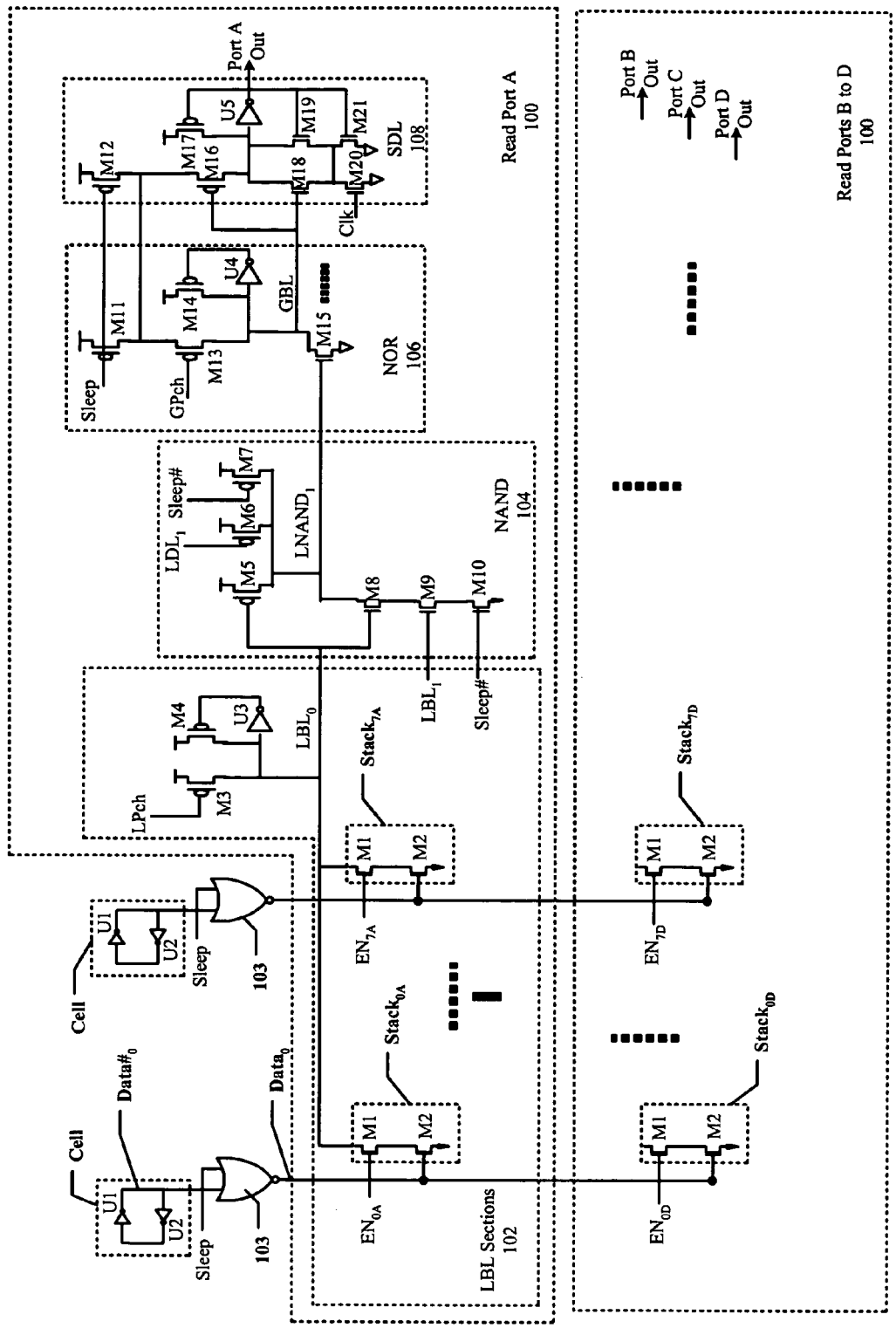
FIG. 1 is a schematic diagram of a portion of a multi-read port circuit with reduced sleep mode leakage in accordance with some embodiments.

FIG. 1 shows a portion of a multiple read port dynamic-logic structure for a 64-bit register circuit having four read ports 100 (A to D). It uses segmentation to combine multiple local bit line (LBL) sections into a global structure, feeding multiple local bit lines into a common global bit line (GBL) for each read port 100. (For ease of understanding, a 64-bit register example is used in this discussion, but it should be appreciated that registers of any size and configuration are within the scope of the invention. In addition, read port A is primarily discussed, but references to the other ports may be made when appropriate. It should be understood that the description regarding port A generally applies to the other ports.)

The depicted read port 100 (port A) generally comprises local bit line sections 102 coupled to segmentation logic comprising NAND circuits 104 and NOR circuit 106 to provide a resulting global bit line (indicated at "GBL"), which in turn is coupled to a set dominant latch (SDL) 108. There are two LBL sections (e.g., $LBL_0$ and $LBL_1$) feeding into each of four separate NAND circuits 104. In turn, each of the four NAND circuits 104 feeds into a separate transistor (e.g., M15) of the NOR circuit 106. (Note that only one of the eight local bit line sections (section 0) is shown; likewise, for the depicted LBL section, only one of its four NAND circuits 104 is shown.)

Each LBL section comprises 8 pull-down stacks with each stack coupled between its associated local bit line and its associated data cell through an isolation driver, NOR gate 103 to convey the contents of its data cell onto its LBL in response to being enabled. Each stack comprises NFETs M1 and M2. In each stack, M1 functions as an enabling transistor and M2 functions as a data transistor. When the enabling transistor (M1) is turned on, the data value (Data) from an associated cell can be conveyed to its associated local bit line (LBL).

(The term "NFET" refers to an N-type metal oxide semiconductor field effect transistor. Likewise, when used herein, "PFET" refers to a P-type metal oxide semiconductor field effect transistor. It should be appreciated that whenever the terms, "NFET", "PFET", and "transistor," are used, unless otherwise expressly indicated or dictated by the nature of their use, they are being used in an exemplary manner. They encompass the different varieties of MOS devices including devices that don't literally use "metal", i.e., using another suitable material in place of metal such as polysilicon, and devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of multi-gated transistors, known today or not yet developed.)

The LBL section 102 also includes a precharge PFET M3 coupled between Vcc and the LBL node to precharge the node and keeper circuitry formed from PFET M4 and inverter U3 to hold a High value, when appropriate, at the LBL node. The local bit line (LBL) functions as an evaluate node providing the data value from a selected (enabled) stack during an evaluate state after the LBL has been precharged VIA M3.

Note that an isolation driver 103 is used for each bit to provide the Data signal to an appropriate stack (e.g., $Stack_0$) for each port. In the depicted embodiment, a two input NOR circuit is used with one input coupled to the Data# output from a data cell and the other input coupled to a Sleep signal. During an active (non sleep) mode, the Sleep signal is at a Low resulting in the isolation driver functioning as a normal inverting driver to drive the data into the stacks. On the other hand, when the sleep mode is entered, the Sleep signal goes High thereby applying a Low at the inputs of each data transistor M2. This results in reduced leakage from the stacks during the sleep mode.

NAND circuit 104 comprises input NFETs M8, M9 coupled between an output node (LNAND) and a sleep mode footer transistor, NFET M10, which is coupled to Vss. It also comprises parallel-coupled pull-up PFET M5, pull-up PFET M6, and sleep mode pull-up PFET M7 all coupled to the LNAND node. The 2 LBL inputs ($LBL_0$ and $LBL_1$ in the depicted embodiment) are coupled to the input NFETs M8, M9, with the Sleep# signal coupled to the sleep mode footer transistor M10 and to the sleep mode pull-up transistor M7. In active mode (Sleep# is High), NAND circuit 104 functions as a normal NAND circuit conveying the logical NAND result of $LBL_0$ and $LBL_1$ to the LNAND output node. When in sleep mode, however, Sleep# goes Low, which causes footer transistor M10 to turn off and sleep mode pull-up transistor M7 to turn on. This results in an overall reduction in leakage for the following reasons.

In the depicted embodiment, the sleep mode pull-up transistor (M7) is used to maintain a High at the $LNAND_1$ node during a sleep mode. This reduces both gate and sub-threshold leakage in the pull-up transistors M5 and M6 during the sleep mode because it substantially eliminates any voltages dropped across their gate-drain and source-drain junctions. However, during a sleep mode, the LBL nodes are typically High, which means that input transistors M8 and M9 are turned on. Thus, the sleep mode footer transistor M10 functions to inhibit current that would otherwise drain from the $LNAND_1$ node through to Vss. The addition of a footer transistor will typically not impede performance because the critical path will usually be through the PFETs. With this in mind, however, in some embodiments, M10 may be made relatively large and shared among the NAND circuits in the read port or even through all of the read ports depending on layout constraints. Alternatively but along these lines, instead of a "big" single sleep mode footer transistor M10 common to multiple NAND circuits 104, individual or combinations of individual footer transistors, coupled together in parallel could be used depending on design considerations.

The NOR circuit 106 comprises a GBL evaluate node, input NFETs M15 (one of which is shown) coupled to the GBL node, and a pull-up section also coupled to the GBL node. The pull-up section comprises precharge PFET M13 coupled to the GBL node, a keeper circuit formed from PFET M14 and inverter U4 also coupled to the GBL node, and pull-up enable PFET M11 coupled between Vcc and the pull-up section. Under normal active mode operation, a NOR operation result of the four input LNAND (LNAND$_2$, LNAND$_3$, and LNAND$_4$ not shown) nodes is provided at the GBL node during an evaluate state. (This value corresponds to the bit being read from this port. It is provided as the read port output by the SDL 108, discussed below.) IN sleep mode, however, with the LNAND nodes being High (previous section), the pull-up enable PFET M11 is turned off (Sleep Low) to decouple Vcc from the GBL node. This prevents Vcc from being shorted to Vss through the input transistors M15, which will be turned on with the LBL nodes being High, as discussed in the previous section.

Set dominant latch (SDL) 108 comprises pull-up PFET M16, a keeper formed from PFET M17 and inverter U5, NFETs M18-M21, and pull-up enable PFET M12, coupled together as indicated. The SDL serves to latch the evaluated GBL node value through to its output (e.g., Port A Output). The pull-up enable PFET M12 serves to disable the SDL during a sleep mode in order to preserve its stored value. During sleep mode (Sleep is High), the pull-up PFET M12 is turned off, thereby preventing the SDL from changing state. On the other hand, when the circuit is active (Sleep is Low), the pull-up enable PFET M12 is turned on, which enables the SDL 108 to operate in a normal fashion.

From a layout and power savings perspective, it is worth noting that the drains of pull-up enable PFETs M11 and M12 are coupled together. This allows each pull-up enable PFET (M11, M12) to be a fraction (e.g., half) the size that would otherwise be required. Their performance is not impaired because based on the circuitry, it is observed that only one of their respective pull-up sections will turn on at a time. Therefore, each of the NOR and SDL circuits can collectively use both pull-up enable PFETs for supply current without detrimentally drawing needed current away from the other circuit.

Figure 2:
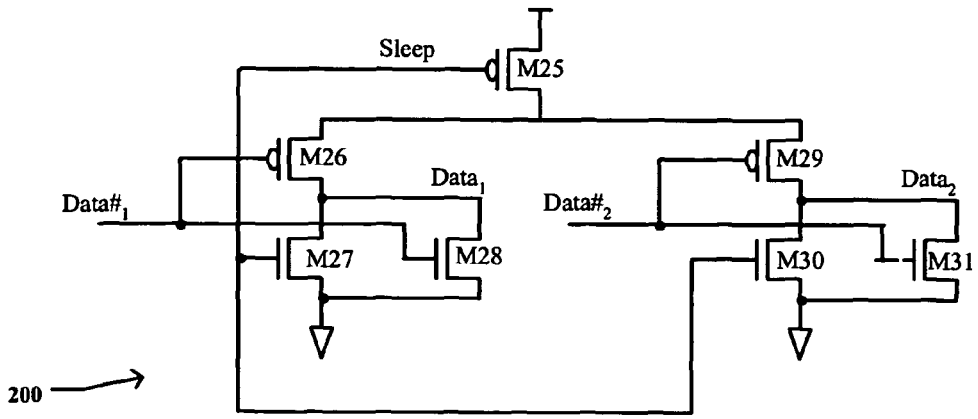
FIG. 2 is a schematic diagram of isolation driver NOR gate circuits with a shared pull-up transistor in accordance with some embodiments.

With referenced to FIG. 2, an example of a NOR circuit 200, suitable for implementing several isolation drivers sharing a common pull-up PFET, is shown. In the depicted embodiment, a circuit for sharing a pull-up PFET M25 between 2 NOR drivers is shown. NOR driver 200 includes FETs M25 to M31 coupled together as indicated. With this topology, several (e.g., 4) isolation drivers could be implemented, sharing the common pull-up PFET M25. the sizing of M25 can depend on the likelihood that all four ports would simultaneously be read thereby activating each of the four drivers at the same time.

Figure 3:
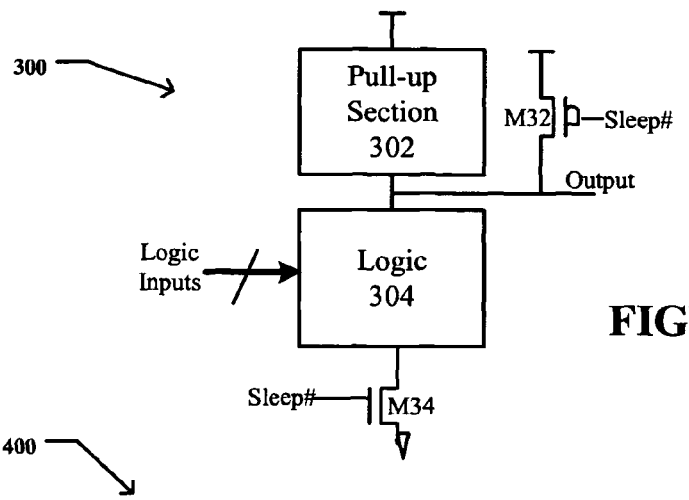
FIG. 3 is a schematic block diagram of a general leakage reduction circuit for a logic circuit in accordance with some embodiments.

FIG. 3 shows a general logic block 300 with reduced leakage sleep mode transistors M32 and M34 in accordance with some embodiments. This circuit generalizes the sleep mode leakage reduction approach used for the NAND circuit 104 of FIG. 1. It generally has a pull-up section 302 coupled to an output node, which is coupled to a pull down logic section 304. (Note that a pull-up section, as used herein, may comprise one or more transistors, for example, to hold and/or help pull-up an output node. Similarly, a pull-down logic section may comprise one or more transistors used to maintain or pull-down charge from an output node based on one or more input signals.) A sleep mode footer M34 is coupled in series between the pull-down logic 304 and Vss, and a sleep mode pull-up PFET M32 is coupled in parallel across the pull up section 302. This circuit may generally be beneficial when an output node is floating or Low to remove a voltage drop across the pull-up section 302 and thereby reduce both gate and sub-threshold leakage in the pull-up section PFETs.

Figure 4:
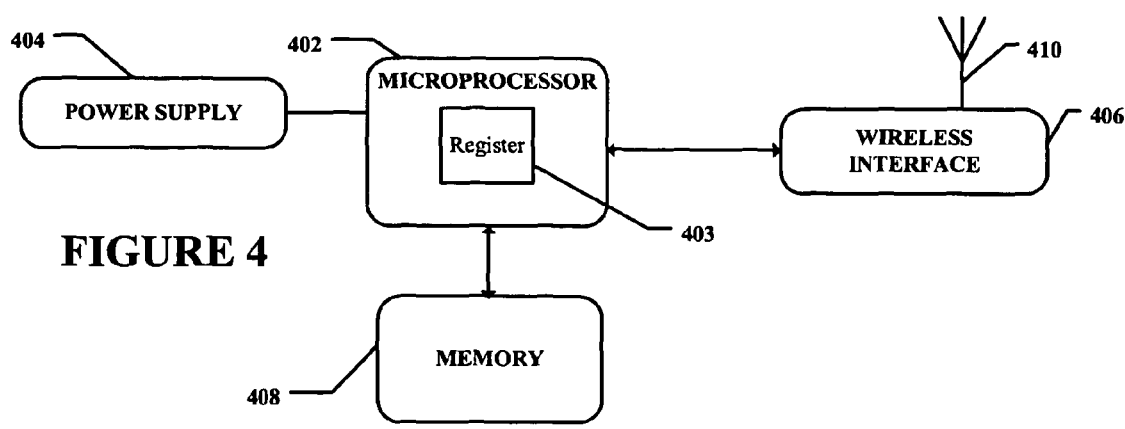
FIG. 4 is a block diagram of a computer system having a microprocessor with at least one register with a read port in accordance with some embodiments.

With reference to FIG. 4, one example of a computer system is shown. The depicted system generally comprises a processor 402 that is coupled to a power supply 404, a wireless interface 406, and memory 408. It is coupled to the power supply 404 to receive from it power when in operation. The wireless interface 406 is coupled to an antenna 410 to communicatively link the processor through the wireless interface chip 406 to a wireless network (not shown). Microprocessor 402 comprises one or more registers 403 with a read port(s) with sleep mode leakage reduction as discussed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/ models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
a circuit comprising a pull-up section, a pull-down logic section, and an output node between said pull-up and pull-down sections;
at least one sleep mode pull-up transistor comprising a PFET coupled across the pull-up section to substantially limit a voltage drop across the pull-up section during a sleep mode; and at least one footer transistor comprising an NFET coupled between the pull-down logic section and a Vss to substantially reduce sub-threshold leakage in the pull-down stack during the sleep mode, wherein the at least one footer NFET is shared by additional logic circuits, in which the circuit is part of segmentation logic in a read port circuit, wherein the circuit comprises a NAND circuit to combine the evaluated results of at least two local bit lines that are coupled to data cells through isolation drivers that provide Low data outputs during the sleep mode, the isolation drivers comprising NOR circuits with a first input coupled to a sleep mode signal and a second input coupled to a data cell.

2. The chip of claim 1, in which the read port comprises two or more additional functional circuits having pull-up circuits, the functional circuits comprising pull-up enable transistors to provide their pull-up sections with supply power when in an active mode and to decouple power from their pull-up sections during the sleep mode.

3. The chip of claim 2, in which the pull-up transistors comprise PFETs with their drains coupled to one another.

4. A system, comprising:
   (a) a microprocessor comprising
      a circuit comprising a pull-up section, a pull-down logic section, and an output node between said pull-up and pull-down sections, and
      at least one sleep mode pull-up transistor coupled across the pull-up section to substantially limit a voltage drop across the pull-up section during a sleep mode, the pull-up transistor comprising PFETs with their drains coupled to one another,
      wherein the circuit is part of segmentation logic in a read port and comprises a NAND circuit to combine the evaluated results of at least 2 local bit lines that are coupled to data cells through isolation drivers that provide Low data outputs during the sleep mode, the isolation drivers comprise NOR circuits with a first input coupled to a sleep mode signal and a second input coupled to a data cell, wherein the read port comprises two or more additional functional circuits having pull-up circuits, the functional circuits comprising pull-up enable transistors to provide their pull-up sections with supply power when in an active mode and to decouple power from their pull-up sections during the sleep mode;
   (b) an antenna; and
   (c) a wireless interface coupled to the microprocessor and to the antenna to communicatively link the microprocessor to a wireless network.

5. The system of claim 4, further comprising a battery to provide supply power to the microprocessor.

* * * * *